United States Patent
Herzum et al.

(10) Patent No.: US 6,887,764 B2
(45) Date of Patent: May 3, 2005

(54) METHOD FOR PRODUCING A GATE STRUCTURE FOR AN MOS TRANSISTOR

(75) Inventors: Christian Herzum, Poecking (DE); Karlheinz Mueller, Velden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/821,251

(22) Filed: Apr. 8, 2004

(65) Prior Publication Data

US 2004/0266152 A1 Dec. 30, 2004

Related U.S. Application Data

(63) Continuation of application No. PCT/EP02/11084, filed on Oct. 2, 2002.

(30) Foreign Application Priority Data

Oct. 8, 2001 (DE) .......................................... 101 49 541

(51) Int. Cl.[7] ...................... H01L 21/336; H01L 21/425
(52) U.S. Cl. ........................ 438/303; 438/301; 438/530
(58) Field of Search ................................ 438/303, 301, 438/305, 320, 443, 261, 530, 723

(56) References Cited

U.S. PATENT DOCUMENTS

| | | | | |
|---|---|---|---|---|
| 4,952,525 A | * | 8/1990 | van der Plas | 438/723 |
| 5,424,227 A | * | 6/1995 | Dietrich et al. | 438/320 |
| 5,741,737 A | | 4/1998 | Kachelmeier | |
| 5,817,536 A | * | 10/1998 | Nayak et al. | 438/530 |
| 5,858,844 A | * | 1/1999 | Fang et al. | 438/303 |
| 6,136,657 A | * | 10/2000 | Yang et al. | 438/303 |
| 6,225,162 B1 | * | 5/2001 | Lin et al. | 438/261 |
| 6,281,079 B1 | | 8/2001 | Heineck et al. | |
| 2004/0185646 A1 | | 9/2004 | Herzum | |

FOREIGN PATENT DOCUMENTS

| | | |
|---|---|---|
| DE | 198 12 212 A1 | 9/1999 |
| DE | 101 31 917 A1 | 1/2003 |

\* cited by examiner

*Primary Examiner*—John F. Niebling
*Assistant Examiner*—Walter L. Lindsay, Jr.
(74) *Attorney, Agent, or Firm*—Maginot, Moore & Beck

(57) ABSTRACT

In a method for producing a gate structure for a MOS transistor, first, a layer sequence of oxide layer, auxiliary layer and masking layer is generated on a substrate, wherein the auxiliary layer and the masking layer are patterned to determine an edge separating an area of the oxide layer covered by these layers from an exposed area thereof. Afterwards, an oxidation is performed to generate an oxide ramp in the area of the edge. Then, the auxiliary layer is partly removed to generate a hollow space of predetermined length between the oxide layer and the masking layer. A gate electrode material is introduced into the hollow space for generating a gate electrode.

20 Claims, 3 Drawing Sheets

METHOD FOR PRODUCING A GATE STRUCTURE FOR AN MOS TRANSISTOR

CROSS-REFERENCE TO RELATED APPLICATION

This application is a continuation of copending International Application No. PCT/EP02/11084, filed Oct. 2, 2002, which designated the Untied States and was not published in English.

BACKGROUND OF THE INVENTION

1. Field of the Invention

The present invention refers to a method for producing a gate structure for an MOS transistor and particularly an MOS transistor whose gate oxide has a ramp-shaped shape between source region and drain region.

2. Description of the Related Art

Basically, the production of a MOS transistor is performed in a known way by generating a gate structure on a channel area later disposed between a source region and a drain region. For generating the gate structure a $SiO_2$ layer (gate oxide) will be generated or deposited as dielectricum, on which a Polysilicon layer will be generated as gate electrode layer.

For certain applications, such as LDMOS transistors, it can be advantageous that the dielectric of the gate electrode, i.e. the gate oxide, has a lower thickness on the source side than on the drain side. This combines the call for a low resistance $R_{on}$ (i.e. a gate oxide as thin as possible) on the source side, and for a high dielectric strength, i.e. a gate oxide as thick as possible, on the drain side. To realize such a gate oxide, up to now, an "oxide ramp" was provided and, as a result, the alignment of the gate electrode was altered on this ramp. Since this method cannot self-adjust to correct the alignment of the gate electrode, restrictions result due to the limited alignment capabilities of the exposure equipment for structuring the polysilicon layer from which the gate electrode is generated.

SUMMARY OF THE INVENTION

It is the object of the present invention to create an improved method for producing a gate structure for an MOS transistor whose gate oxide is formed by an oxide ramp.

In accordance with a first aspect, the present invention provides a method for producing a gate structure for a MOS transistor, having: generating a layer sequence from an oxide layer, an auxiliary layer and a masking layer on a substrate, the auxiliary layer and the masking layer being structured to determine an edge separating an area of the oxide layer covered by these layers from an exposed area of it; performing an oxidation for generating an oxide ramp in the area of the edge; partly removing the auxiliary layer for generating a hollow space of predetermined length between the oxide layer and the masking layer; and introducing a gate electrode material into the hollow space for generating a gate electrode.

In the inventive method, a so-called bird beak, i.e. an area with constantly rising oxide thickness, which can also be referred to as oxide ramp, is formed by the step of oxidating at the edge of the auxiliary layer bordering on the oxide layer. The present invention utilized the fact that the oxide ramp is at least partly generated below the auxiliary layer and the masking layer covering the oxide layer, to realize a self-adjusted generation of a gate electrode layer. For that purpose, the edge is used, so to speak, as "adjustment feature", by generating a hollow space of predetermine length beginning from the edge by removing the auxiliary layer, into which the gate electrode material will be introduced to generate the gate electrode. Thus, the gate electrode is adjusted relative to the edge and thus relative to the oxide ramp having a defined positional relationship with respect to the edge.

Thus, according to the present invention, the gate electrode will be generated self-adjusted, so that in contrary to the prior art the adjustment has not to be performed by structuring a fully deposited gate electrode layer with the limited adjustment possibilities associated therewith. Thus, the inventive method does not need additional masking steps and lithography steps for adjustment. Further, the inventive method can cause a very accurate adjustment, whose accuracy is not affected by restrictions with respect to the limited adjustment possibilities of the exposure equipment.

According to the invention, the gate electrode material will preferably be introduced in the pocket-shaped hollow space below the masking layer, by first depositing a gate electrode material layer on the structure, wherein this material enters also the above-mentioned hollow space and fills it. Afterwards, the deposited layer will be removed selectively, so that the part of the gate electrode material being in the hollow space remains as gate electrode.

BRIEF DESCRIPTION OF THE DRAWINGS

Preferred embodiments of the present invention will be discussed in more detail with reference to the accompanying drawings. They show.

DESCRIPTION OF THE PREFERRED EMBODIMENTS

Figure 1:
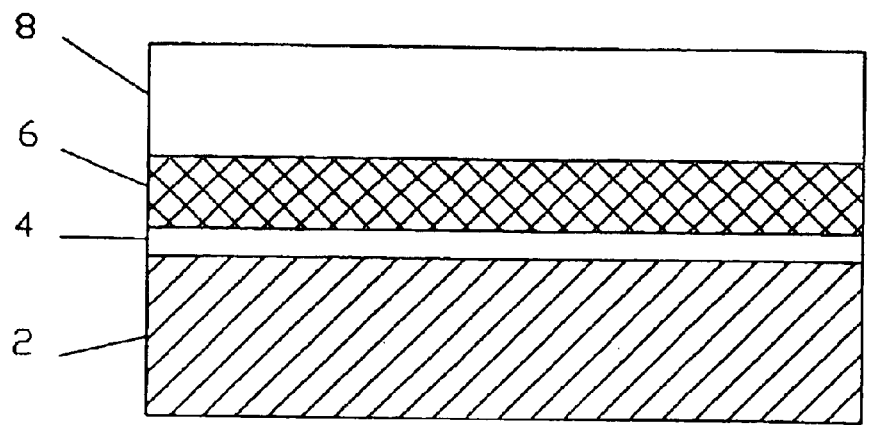
FIG. 1 to 8 cross-sectional views of different process stages of a preferred embodiment of the inventive method.

In the preferred embodiment of the inventive method, first, a lower silicon oxide layer ($SiO_2$) 4 is applied on a starting material, which is preferably a silicon substrate 2. On the lower silicon oxide layer 4, a silicon nitride layer ($Si_3N_4$) 6 is deposited, on which again an upper silicon oxide layer ($SiO_2$) 8 is deposited. The oxide layer 4 can, for example, be generated by a thermal oxidation, while the silicon nitride layer 6 and the silicon layer 8, respectively, can, for example, be generated and deposited, respectively, from the gas phase in a known way. The resulting structure is illustrated in FIG. 1.

Figure 2:
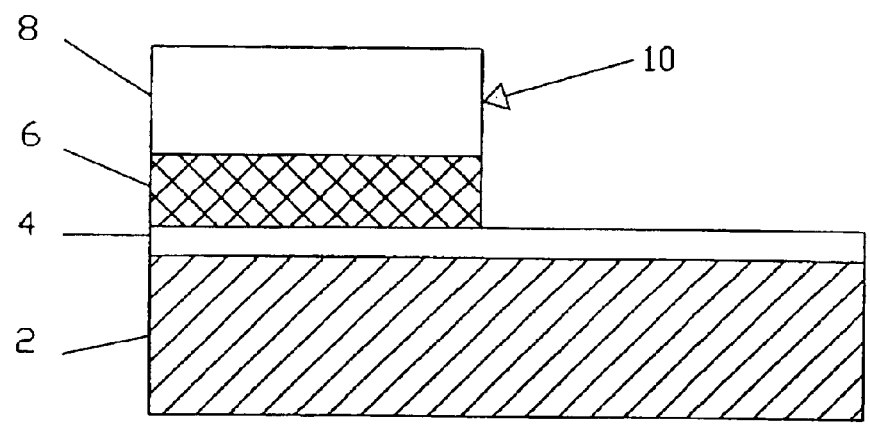
Figure 3:
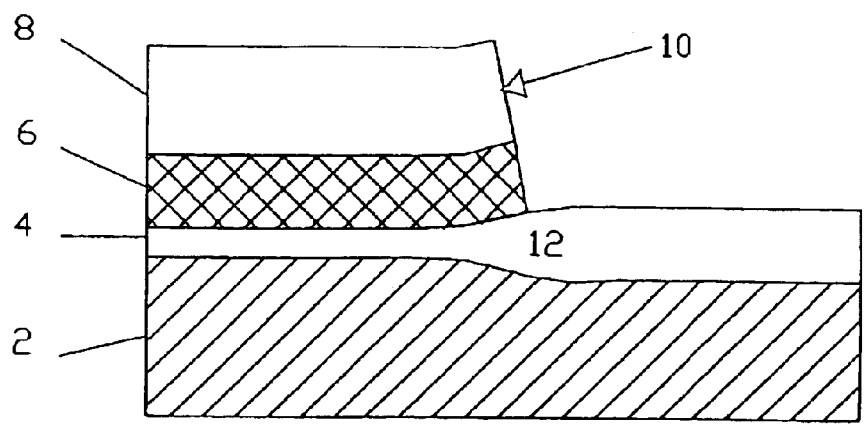

Afterwards, the upper oxide layer 8 and the silicon nitride layer 6 will be patterned by a lithography step and a subsequent etching to define an edge in them, which is separating an area of the oxide layer 4 covered by these two layers 6 and 8 from an exposed area of the oxide layer 4, as illustrated in FIG. 2. After patterning the layers 6 and 8, an oxidation is performed, whereby the thickness of the exposed $SiO_2$ layer 4 increases. At the edge 10 of the previously structured nitride layer 4 a so-called bird beak 12 is formed, i.e. an area with constantly rising oxide thickness, which can also be referred to as oxide ramp 12. The shape of the this oxide ramp can be influenced by the thickness of the oxide layer 4, the thickness of the nitride layer 6 as well as the method parameters in the performed oxidation.

In the oxidation process, a nitride oxide layer, which is not shown, is formed on the front face of the nitride layer 6 of the edge 10, which is removed after the oxidation by a very short oxide etching.

After generating the bird beak or the oxide ramp 12, respectively, the nitride layer 6 will selectively be etched back wet-chemically to generate the hollow space 14 below the upper oxide layer 8 serving as masking layer, i.e. between the upper oxide layer 8 and the lower oxide layer 4. The depth of the hollow space 14 corresponding to the gate length can be set by respective choice of the etching parameters. The resulting structure with the pocket-shaped hollow space 14 is shown in FIG. 4.

Figure 4:
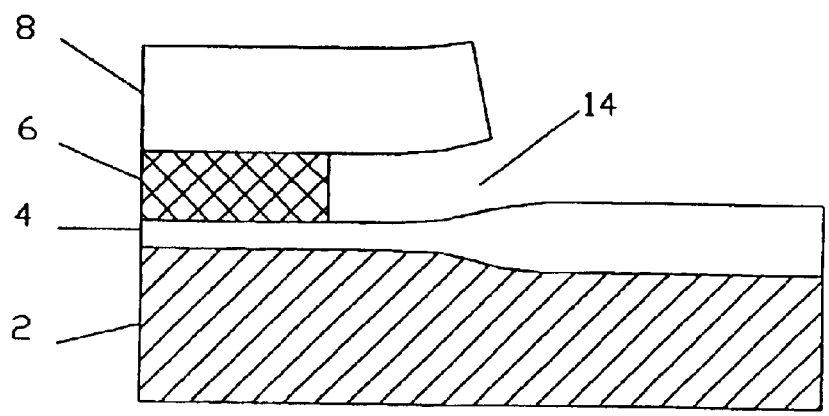
Figure 5:
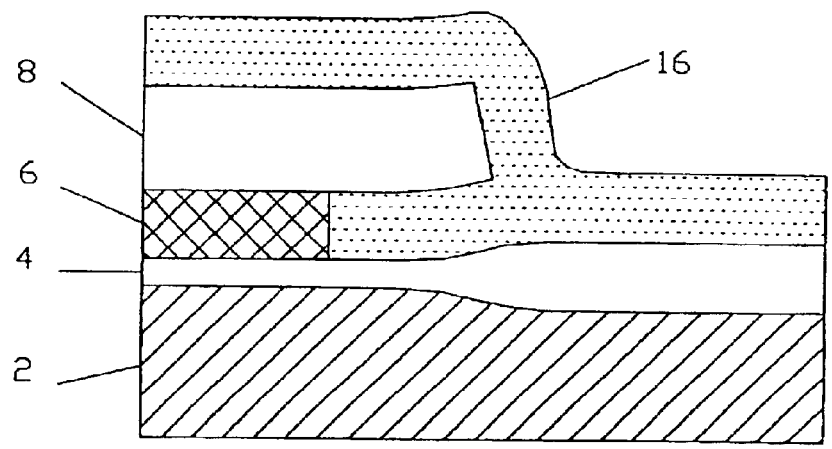

After generating the hollow space 14, a polysilicon layer 16 will be deposited on the structure shown in FIG. 4 in conformity therewith by using known methods. As shown in FIG. 5, the generated polysilicon layer 16 covers the whole surface of the structure and further fills the hollow space 14 fully.

Figure 6:
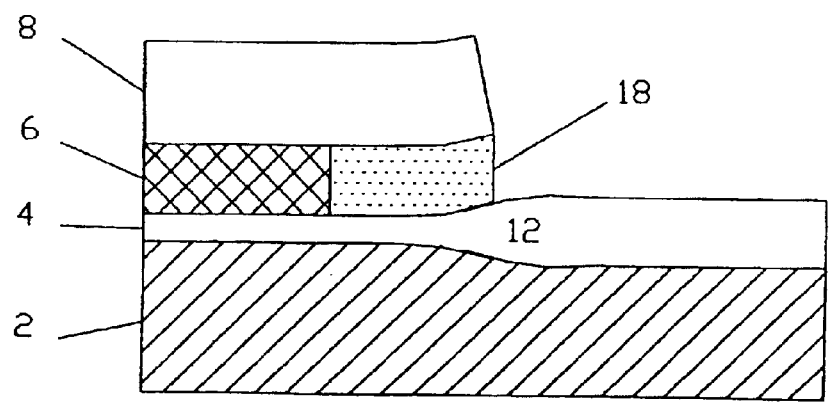

In a subsequent method step, the polysilicon layer 16 will be etched back anisotropically and selectively to silicon oxide, whereby it is fully removed apart from the parts being within the hollow space 14. Thereby, a gate electrode 18 introduced in the hollow space 14 will be generated from the polysilicon layer 16, as shown in FIG. 6. Due to the fact that the hollow space 14 has a fixed spatial relationship to the edge 10 and the edge 10 has a fixed spatial relationship to the oxide ramp 12 the gate electrode 18 formed in the hollow space is adjusted with regard to the oxide ramp 12.

Figure 7:
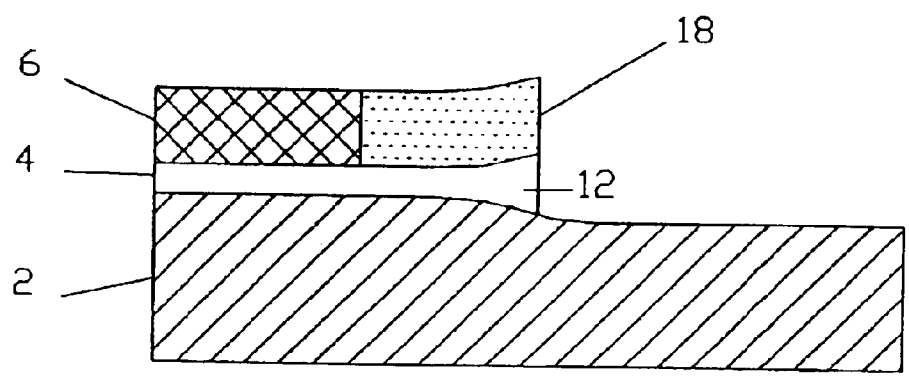

In the shown preferred embodiment, the silicon oxide layer 8 will subsequently be etched back anisotropically and selectively, wherein the resulting structure is shown in FIG. 7. Afterwards, the silicon nitride layer serving as auxiliary layer will be selectively etched to silicon and selectively to silicon oxide, so that the gate structure shown in FIG. 8 results. These steps of selectively removing the silicon oxide layer 8 and the silicon nitride layer 6 are optional, depending on how the gate electrode is to be contacted.

Figure 8:
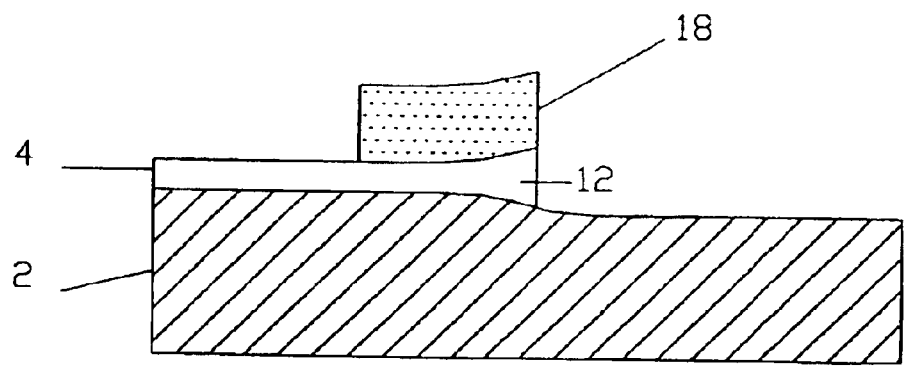

The structure shown in FIG. 8 can now serve as a starting base for generating a MOS transistor. Here, it should be noted, that, depending on the process, steps for generating the other transistor structures, such as the drain regions or source regions can already be performed prior or during performing the inventive method for generating a gate structure.

The process steps necessary for performing the inventive method can all be performed by techniques known in the art, wherein the choice of appropriate depositing methods for depositing the individual layers, appropriate structuring methods, appropriate edge means as well as further appropriate method parameters are obvious for a person skilled in the art. Further, it is obvious that the materials described above with regard to the preferred embodiments are only exemplary and that other materials with similar properties can be used instead of the ones described. For example, instead of a silicon substrate a silicon carbide substrate (SiC) can be used as substrate 2.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for producing a gate structure for an MOS transistor, comprising:
    generating a layer sequence of an oxide layer, an auxiliary layer and a masking layer on a substrate, wherein the auxiliary layer and the masking layer are structured to determine an edge separating an area of the oxide layer covered with these layers from an exposed area thereof;
    performing an oxidation to generate an oxide ramp in the area of the edge;
    partly removing the auxiliary layer to generate a hollow space of a predetermined length between the oxide layer and the masking layer; and
    introducing a gate electrode material into the hollow space to generate a gate electrode.

2. The method according to claim 1, wherein the substrate comprises a silicon substrate, the oxide layer comprises a silicon oxide layer, the auxiliary layer comprises a silicon nitride layer and the masking layer comprises a silicon oxide layer.

3. The method according to claim 1, wherein the gate electrode material comprises polysilicon.

4. The method according to claim 1, further comprising the step of removing an oxide formed during the oxidation on a sidewall of the auxiliary layer, which is located at the edge, prior to partly removing the auxiliary layer.

5. The method according to claim 4, wherein the oxide on the sidewall of the auxiliary layer is removed by an oxide etching.

6. The method according to claim 1, wherein the auxiliary layer is etched back selectively wet-chemically for generating the hollow space.

7. The method according to claim 1, wherein introducing the gate electrode material into the hollow space comprises:
    depositing a gate electrode material layer on the structure present after generating the hollow space, wherein the hollow space is also filled in with the gate electrode material; and
    anisotropically and selectively back-etching the gate electrode material layer outside the hollow space filled with gate electrode material.

8. The method according to claim 1, further comprising a step of removing at least the masking layer for exposing the gate electrode.

9. The method according to claim 8, wherein the step of removing at least the masking layer comprises a step of anisotropically and selectively back-etching the masking layer.

10. The method according to claim 8, further comprising a step of anisotropically and selectively back-etching the auxiliary layer.

11. A method for producing a gate structure for an MOS transistor, comprising:
    generating a structure on a substrate, the structure having at least an oxide layer and a masking layer, the masking layer disposed over a part of the oxide layer, the oxide layer including an oxide ramp, the masking layer including an inclined edge disposed above the oxide ramp, the structure further including a hollow space between the oxide layer and the masking layer; and
    introducing a gate electrode material into the hollow space to generate a gate electrode.

12. The method according to claim 11, wherein the substrate comprises a silicon substrate, the oxide layer comprises a silicon oxide layer, and the masking layer comprises a silicon oxide layer.

13. The method according to claim 11, wherein the gate electrode material comprises polysilicon.

14. The method according to claim 11, wherein generating the structure on the substrate, further comprises providing a partial auxiliary layer disposed between the oxide layer and the masking layer and adjacent to the hollow space.

15. The method according to claim 11, wherein generating the structure on the substrate further comprises forming the hollow space by removing material from an auxiliary layer, the auxiliary layer including the partial auxiliary layer.

16. The method according to claim 15, wherein the auxiliary layer is etched back selectively wet-chemically to generate the hollow space.

17. The method according to claim 11, wherein introducing the gate electrode material into the hollow space comprises:
- depositing a gate electrode material layer on the structure present after generating the hollow space, wherein the hollow space is also filled in with the gate electrode material; and
- anisotropically and selectively back-etching the gate electrode material layer outside the hollow space filled with gate electrode material.

18. The method according to claim 11, further comprising a step of removing at least the masking layer for exposing the gate electrode.

19. The method according to claim 18, wherein the step of removing at least the masking layer comprises a step of anisotropically and selectively back-etching the masking layer.

20. The method according to claim 18, wherein generating the structure on the substrate further comprises providing a partial auxiliary layer disposed between the oxide layer and the masking layer and adjacent to the hollow space, the method further comprising a step of anisotropically and selectively back-etching the auxiliary layer.

* * * * *